US012668485B2

(12) United States Patent
Busani et al.

(10) Patent No.: US 12,668,485 B2
(45) Date of Patent: Jun. 30, 2026

(54) INATTENTIVE HF CONCENTRATION VAPORS PHASE RELEASE OF MICRO-ELECTRO-MECHANICAL SYSTEMS AND OPTICAL SYSTEMS

(71) Applicant: UNM Rainforest Innovations, Albuquerque, NM (US)

(72) Inventors: Tito Busani, Albuquerque, NM (US); Ravi Kiran Chityala, Albuquerque, NM (US); Arjun Aryal, Albuquerque, NM (US)

(73) Assignee: UNM Rainforest Innovations, Albuquerque, NM (US)

( * ) Notice: Subject to any disclaimer, the term of this patent is extended or adjusted under 35 U.S.C. 154(b) by 140 days.

(21) Appl. No.: 18/496,823

(22) Filed: Oct. 27, 2023

(65) Prior Publication Data

US 2024/0140786 A1 May 2, 2024

Related U.S. Application Data

(60) Provisional application No. 63/420,069, filed on Oct. 27, 2022.

(51) Int. Cl.
*B81C 99/00* (2010.01)

(52) U.S. Cl.
CPC ...... *B81C 99/008* (2013.01); *B81C 2201/038* (2013.01)

(58) Field of Classification Search
None
See application file for complete search history.

(56) References Cited

U.S. PATENT DOCUMENTS

| | | | |
|---|---|---|---|
| 6,162,585 A | 12/2000 | Zhang et al. | |
| 6,238,580 B1 | 5/2001 | Cole et al. | |
| 6,740,247 B1 | 5/2004 | Han et al. | |
| 6,806,205 B2 | 10/2004 | Jang et al. | |
| 2014/0017901 A1* | 1/2014 | O'Hara | H01L 21/30604 |
| | | | 438/735 |
| 2015/0364363 A1* | 12/2015 | Wu | B81B 7/008 |
| | | | 257/777 |
| 2016/0068388 A1* | 3/2016 | Daneman | B81C 1/00801 |
| | | | 257/415 |
| 2022/0073343 A1* | 3/2022 | Ghyselen | H10N 30/072 |
| 2022/0293427 A1* | 9/2022 | Romano | H10F 77/122 |

* cited by examiner

*Primary Examiner* — Shamim Ahmed
(74) *Attorney, Agent, or Firm* — Keith Vogt, Ltd.; Keith A. Vogt

(57) ABSTRACT

A low-cost, conventional release using low concentrations of HF to overcome the stiction of MEMS structure.

15 Claims, 2 Drawing Sheets

100          100

200          200          200

INATTENTIVE HF CONCENTRATION VAPORS PHASE RELEASE OF MICRO-ELECTRO-MECHANICAL SYSTEMS AND OPTICAL SYSTEMS

RELATED APPLICATIONS

This application claims priority to U.S. Provisional Application No. 63/420,069, filed on Oct. 27, 2023, which is incorporated herein in its entirety.

STATEMENT REGARDING FEDERALLY SPONSORED RESEARCH & DEVELOPMENT

Not applicable.

INCORPORATION BY REFERENCE OF MATERIAL SUBMITTED ON A COMPACT DISC

Not applicable.

BACKGROUND OF THE INVENTION

In recent times MEMS and optical systems have drawn much attention for the development of RF and sensor applications. Generally, MEMS are formed with a minimum of two layers composition on the substrate, one containing MEMS structures, and another is a sacrificial layer. Usually, the wafer is immersed in wet solutions for the sacrificial layer to dissolve to form the suspended MEMS structure. Other methods use Vapor HP with concentration higher than 49%, other mixed water in vapor phase with HF vapor. The wet solutions may lead to low yield because of the stiction of MEMS structure to the substrate because of cohesive forces of the small gap between the MEMS structures and liquid. The vapor phases with high concentration of HF are usually very aggressive and limit the application to a few materials. Moreover, they also limit the quality of the release on a large area.

BRIEF SUMMARY OF THE INVENTION

In one embodiment, the present invention concerns a low-cost, conventional release using low concentrations of HF to overcome the stiction of MEMS structure.

In another embodiment, the present invention concerns a low-cost, conventional release using low concentrations of HF to overcome the stiction of MEMS structure wherein the low concentration of HF has a very good selective etching of SiO2.

In other aspects, the present invention uses a selective uniform HF vapor phase release for MEMS and optical systems.

In other aspects, the present invention uses Hydrofluoric (HF) acid vapor etching to release micro-electro-mechanical systems (MEMS) and optical systems independent of temperature, pressure, and concentration.

In other aspects, the present invention provides an inattentive concentration of HF vapor release. The HF vapors dissolve a sacrificial layer to separate MEMS or optical system surfaces from the substrate (underlayer). This embodiment of the present invention may be utilized with any MEMS or optical material and substrate which doesn't, or reacts very slowly, with HF vapors. The sacrificial layer needs to be reactive with HF vapors for dissolving to separate substrate from MEMS and optical system.

In other aspects, the present invention uses SiO2 as a sacrificial layer but may also be used with metal sacrificial layer materials like Titanium, Aluminum, and Copper.

It is to be understood that both the foregoing general description and the following detailed description are exemplary and explanatory only and are not restrictive of the invention, as claimed.

BRIEF DESCRIPTION OF THE SEVERAL VIEWS OF THE DRAWINGS

In the drawings, which are not necessarily drawn to scale, like numerals may describe substantially similar components throughout the several views. Like numerals having different letter suffixes may represent different instances of substantially similar components. The drawings illustrate generally, by way of example, but not by way of limitation, a detailed description of certain embodiments discussed in the present document.

DETAILED DESCRIPTION OF THE INVENTION

Figure 1:
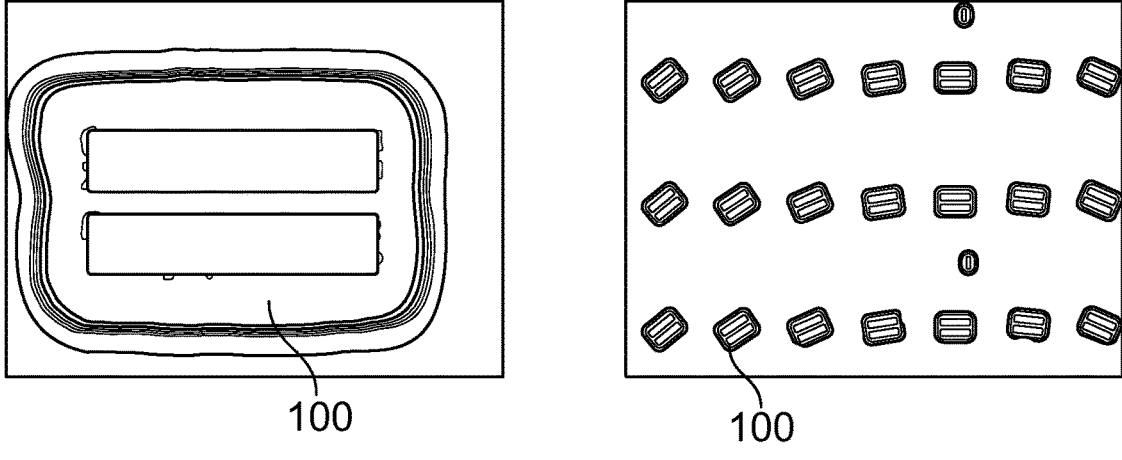
FIG. 1 illustrates a MEMS device Vapor Release for 10 minutes with 48% concentration HF. Release region (shaded) is about 50 microns with no damage to the upper layer.

Detailed embodiments of the present invention are disclosed herein; however, it is to be understood that the disclosed embodiments are merely exemplary of the invention, which may be embodied in various forms. Therefore, specific structural and functional details disclosed herein are not to be interpreted as limiting, but merely as a representative basis for teaching one skilled in the art to variously employ the present invention in virtually any appropriately detailed method, structure, or system. Further, the terms and phrases used herein are not intended to be limiting, but rather to provide an understandable description of the invention.

In one embodiment, the present invention provides a low-cost, conventional release using low concentration HF to overcome the stiction of MEMS structure. In one preferred embodiment, 48% or 25% HF concentrations may be used. The 48% concentration of HF released a 220 nm structure in 16 minutes at room temperature. The wafer and HF solution is separated at a distance of approximately 5 cm. The 48% HF released a structure of up to 220 $\mu$m without collapsing the structure.

A 25% of HF concentration produced a very uniform and controlled release in which the release region can be controlled with respect to time. The 25% or a lesser concentration HF may be used for the micro-scale structural release up to 250 $\mu$m. The release region is not limited to that value as it may depend on the thickness of top material film, the concentration of HF and the distance between the sample and solution.

It has also been found that there is a higher degree of control over the release using lower concentrations. Lower concentrations have a higher level of uniform release all over the features of the structure as compared to a higher concentration. The lower concentration also protects features from collapsing.

In another embodiment, the present invention provides a process wherein the concentration of HF may be <1% HF. At this lower concentration, the process of the present invention has several advantages over the use of higher concentrations which are greater than 48%.

The embodiments of the present invention are not limited to the sample size. The embodiments of the present invention may also be used for wafer-scale release processes as well. The embodiments of the present invention are also scalable to 12 inches wafers or larger.

The low concentration controlled released can also be used for Nano-electro-mechanical-systems. The release process is not only limited to HF release but also may applied to the release of III-V sacrificial material layers using Tetramethylammonium hydroxide (TMAH) vapors as silicon has very good selective etching with TMAH.

The sacrificial layer needs to be reactive with HF vapors for dissolving to separate the substrate from MEMS and optical system. In one exemplary case, a SiO2 sacrificial layer was used, but the embodiments of the present invention are not limited to SiO2 and may be used with metal sacrificial layer materials like Titanium, Aluminum, and Copper.

Figure 2:
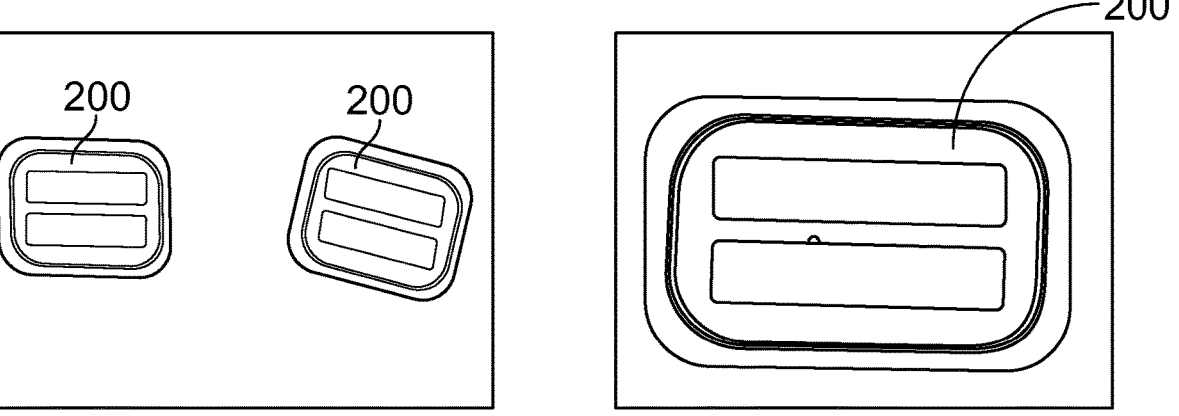
FIG. 2 illustrates a MEMS device Vapor Release for 5 minutes with 24% concentration HF.

In one embodiment, the present invention used 48% and 24% of HF concentration in an aqueous solution which may include water, DI water and other dilutants. For this embodiment, SiO2 was used as the sacrificial layer. A FIGS. 1 and 2 show the results of the present invention. FIG. 1 shows the results of MEMS device Vapor Release for 10 minutes with 48% concentration HF. Release region 100 is about 50 microns with no damage to the upper layer. FIG. 2 shows the results of MEMS device Vapor Release for 5 minutes with 24%. Release region 200 is about 50 microns with no damage to the upper layer. concentration HF.

In other preferred embodiments of the present invention, the predetermined time is around 10 minutes, around 16 minutes. around 25 minutes or around 35 minutes. In other preferred embodiments of the present invention, the predetermined time is equal to or greater than 10 minutes, 16 minutes, 25 minutes or 35 minutes.

In one preferred embodiment, the present invention provides a method to release a micro-electro-mechanical structure (MEMS) from a sacrificial substrate comprising the steps of providing an aqueous solution comprised of a predetermined concentration of HF; locating the substrate a predetermined distance from said aqueous solution of HF; and exposing the substrate to vapors released from the aqueous solution of HF until the MEMS structure is released from said substrate.

The concentration of HF in the aqueous solution may be 48% or less, 25% or less, or 1% or less and the predetermined distance is around 5 cm.

Figure 3:
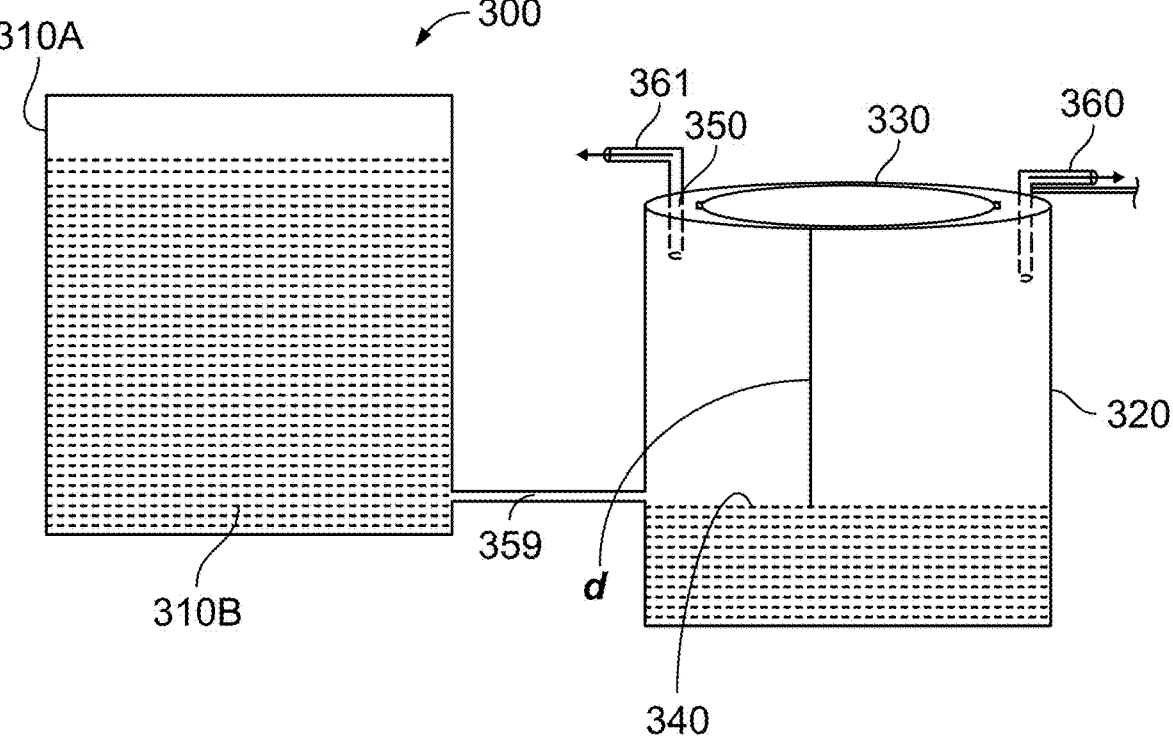
FIG. 3 shows a hydrofluoric (HF) acid Vapor Phase Etching (VPE) system that may be used with the embodiments of the present invention.

FIG. 3 shows a hydrofluoric (HF) acid Vapor Phase Etching (VPE) system 300 that may be used with the embodiments of the present invention. System 300 includes first container 310A which may be closed and holds the desired concentration of HF 310B in liquid form. First container 310A is in communication with Teflon chamber 320 that is used to treat a wafer or substrate 330 with the desired HF concentration in liquid form. Chamber 320 is configured to hold substrate or wafer 33o a predetermined distance "d" above the top surface of liquid 340 in chamber 3230 by use of holder 350. Valve 359n controls the level of liquid 340 and vents 360-361 permit the vapor from liquid 340 to flow into contact with substrate or wafer 330.

While the foregoing written description enables one of ordinary skill to make and use what is considered presently to be the best mode thereof, those of ordinary skill will understand and appreciate the existence of variations, combinations, and equivalents of the specific embodiment, method, and examples herein. The disclosure should therefore not be limited by the above-described embodiments, methods, and examples, but by all embodiments and methods within the scope and spirit of the disclosure.

What is claimed is:

1. A method to release micro-electro-mechanical structure (MEMS) from a sacrificial substrate comprising the steps of: providing an aqueous solution of hydrofluoric acid; locating said substrate a distance from said aqueous solution of hydrofluoric acid; exposing said substrate to vapors released from said aqueous solution of hydrofluoric acid until said MEMS structure is released from said substrate; and said aqueous solution of hydrofluoric acid has a concentration of 1% or less.

2. The method of claim 1 wherein said distance is around 5 cm.

3. The method of claim 1 wherein said time is around 10 minutes.

4. The method of claim 1 wherein said time is around 16 minutes.

5. The method of claim 1 wherein said time is around 25 minutes.

6. The method of claim 1 wherein said time is around 35 minutes.

7. The method of claim 1 wherein said sacrificial substrate is $SiO_2$ or an insulating material that can be chemically etched by hydrofluoric acid.

8. The method of claim 1 wherein said sacrificial substrate is a metal.

9. The method of claim 1 wherein said sacrificial substrate is Titanium, Aluminum, Copper, or a metal that is chemically etched by hydrofluoric acid.

10. The method of claim 1 wherein said sacrificial substrate is Titanium, Aluminum, Copper or a metal that is chemically etched by hydrofluoric acid.

11. The method of claim 1 wherein said substrate is a wafer having a diameter of 8 inches or less.

12. The method of claim 1 wherein said hydrofluoric acid concentration is maintained.

13. The method of claim 1 wherein no catalyst is used.

14. The method of claim 1 wherein water is used as a dilutant.

15. The method of claim 1 wherein a chamber temperature below 30° C. allows Hf vapor etching.

* * * * *